United States Patent [19]

Kondo et al.

[11] Patent Number: 5,756,251
[45] Date of Patent: May 26, 1998

[54] METHOD FOR MAKING LITHOGRAPHIC PRINTING PLATE

[75] Inventors: Toshiro Kondo; Akio Yoshida; Hiroyuki Kurokawa; Jun Urasaki; Motozo Yamano; Makiko Oko; Hideaki Baba, all of Tokyo, Japan

[73] Assignee: Mitsubishi Paper Mills Limited, Tokyo, Japan

[21] Appl. No.: 764,020

[22] Filed: Dec. 11, 1996

[30] Foreign Application Priority Data

Dec. 12, 1995 [JP] Japan ................ 7-322853
Dec. 20, 1995 [JP] Japan ................ 7-331705
May 16, 1996 [JP] Japan ................ 8-121483

[51] Int. Cl.$^6$ .................. G03F 7/07; G03C 8/06; G03C 8/36
[52] U.S. Cl. ....................... 430/204; 430/249
[58] Field of Search ....................... 430/204, 249

[56] References Cited

U.S. PATENT DOCUMENTS

| | | | |
|---|---|---|---|
| 3,776,728 | 12/1973 | Suzuki et al. | 430/204 |
| 4,401,739 | 8/1983 | Senga et al. | 430/204 |
| 5,068,164 | 11/1991 | Kondo et al. | 430/204 |
| 5,281,509 | 1/1994 | Murakawa et al. | 430/204 |
| 5,340,691 | 8/1994 | Vaes et al. | 430/204 |
| 5,398,092 | 3/1995 | Tanno et al. | 354/317 |

*Primary Examiner*—Richard L. Schilling
*Attorney, Agent, or Firm*—Cushman Darby and Cushman, Intellectual Group of Pillsbury, Madison & Sutro, LLP

[57] ABSTRACT

Disclosed is a method for making a lithographic printing plate from a photographic element according to the silver complex diffusion transfer process employing a coating development process with a small amount of developer, wherein the coating amount of the developer is 60 ml or less per 1 m$^2$ of the photographic element and the developer contains a mercaptooxadiazole having an alkyl group of 4 or more carbon atoms or aryl group and an alkanolamine and/or a meso-ionic compound. The resulting lithographic printing plate has a high printing endurance and free from stains on the background in spite of carrying out the development by a coating method with a small amount of the developer for a short period of time.

9 Claims, No Drawings

METHOD FOR MAKING LITHOGRAPHIC PRINTING PLATE

BACKGROUND OF THE INVENTION

The present invention relates to a method for making lithographic printing plates utilizing silver complex diffusion transfer process and, particularly, to a method for making lithographic printing plates which involves a step of coating development.

Lithographic printing is carried out by feeding both ink and water to the plate surface to allow the image areas to receive the coloring ink and the non-image areas to receive water selectively, and transferring the ink on the image areas to a substrate such as paper.

Photographic elements for making lithographic printing plates therefrom utilizing silver complex diffusion transfer process (DTR process), especially, those which have a physical development nuclei layer on a silver halide emulsion layer are disclosed, for example, in U.S. Pat. Nos. 3,728,114, 4,134,769, 4,160,670, 4,336,321, 4,501,811, 4,510,228, and 4,621,041.

The exposed silver halide crystal undergoes chemical development in the emulsion layer by developing treatment and becomes blackened silver to form hydrophilic non-image areas. On the other hand, unexposed silver halide crystal is solubilized by the silver complex salt forming agent contained in the developer and diffuses to the surface physical development nuclei layer to precipitate on the physical development nuclei as an ink receptive image silver by the reducing action of the developing agent.

The DTR process has the mechanism of chemical development and solution physical development which proceed simultaneously in one developing treatment. Therefore, in order to obtain good prints, important is to balance the developing speed in the area where chemical development occurs and which becomes the non-image area and the area where solution physical development occurs and which becomes the image area.

For example, if the solution physical development takes preference over the chemical development, deterioration in printing endurance occurs owing to staining of background portion or softening of images. If the chemical development takes preference over the solution physical development, deterioration in printing endurance occurs.

In the presently realized method for making lithographic printing plates utilizing the DTR process, an automatic process camera having therein a developing tank is generally employed. That is, after carrying out the exposure by a process camera, the photographic element is passed through a developing tank storing a large amount of a developer, and, thereafter, the developer remaining on the surface is removed by a mechanical method, for example, by passing the photographic element between squeeze rollers having a contact pressure. Then, the photographic element is passed through a neutralizing tank to adjust pH of the surface and the neutralizing solution remaining on the surface is removed by a mechanical method as in the removal of the developer.

According to the above-mentioned plate-making method, amount of waste developer is extremely great for users who make a large number of plates, and the users must bear a great environmental and economical burden for storage and disposal of the waste solution.

Furthermore, a long time is required for the photographic elements to pass through the developing tank and the neutralizing tank, and, besides, there are the defects such as exhaustion of developers due to processing of a great number of the photographic elements, for example, decrease in pH and formation of sludges.

As processing methods which solve these problems, JP-A-48-76603 and 57-115549 and U.S. Pat. No. 5,398,092 disclose methods of plate-making by coating the surface of photographic elements with a developer, and WO95/18400 discloses a method of coating the photographic elements with a developer by instantaneously dipping them in the developer in a very small developing tank. However, these coating development methods have various problems under the conditions differing from those for conventional dipping development methods and have not yet been practically employed.

That is, in the case of these coating development methods, the surface of the photographic elements is not supplied with a fresh developer after the surface has been coated, and, furthermore, if the coating amount of the developer is reduced for decreasing the amount of waste developer, the balance between the chemical development and the physical development is apt to be lost. As a result, there often occur the defects such as staining of background portions and deterioration in printing endurance.

SUMMARY OF THE INVENTION

The object of the present invention is to provide a method of plate making by which printing plates of high printing endurance and free from staining in background portions can be obtained stably even by carrying out the coating development of the photographic elements with a small amount of a developer by the DTR process.

The above object has been attained by a method of plate making which comprises carrying out the development of the photographic elements utilizing the silver complex diffusion transfer process by coating the surface of the photographic elements with a developer, wherein the coating amount of the developer is 60 ml or less per 1 $m^2$ of the photographic elements and the developer contains a 2-mercapto-5-alkyl(aryl)oxa-3,4-diazole having an alkyl group of 4 or more carbon atoms or aryl group and an alkanolamine and/or a meso-ionic compound.

DESCRIPTION OF THE INVENTION

The coating development method in the present invention generally comprises feeding the developer to the photosensitive surface of the photographic element having a silver halide emulsion layer to coat the surface with the developer and the method is disclosed, for example, in JP-A-48-76603. For example, there are taking-up coating method, dripping type roller coating method, dripping type knife coating method, spray coating method, and brush coating method. Furthermore, roller coating method using a bar coater (manufactured by Eto Chemical Apparatus Co., Ltd.) disclosed in U.S. Pat. No. 5,398,092 and dip coating development method disclosed in WO95/18400 are also preferred.

The coating amount of the developer on the photographic element is 60 ml or less, preferably 10–60 ml, more preferably 20–50 ml per 1 $m^2$ of the photographic element and the developing time (a period of from the coating of the developer to the developer terminating to exhibit the developing effect) is 15 seconds or less, preferably 3–10 seconds.

2-Mercapto-5-alkyl(aryl)oxa-3,4-diazole used in the present invention is a compound having at 5-position an alkyl group of 4 or more carbon atoms or aryl group such as butyl, amyl, hexyl, heptyl, octyl, decyl, dodecyl or the like.

The amount of the 2-mercapto-5-alkyl(aryl)oxa-diazole is 0.01–50 mmols, preferably 0.05–30 mmols for 1 liter of the developer.

The alkanolamines used in the present invention include, for example, (2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-methylaminoethanol and the like. These may be used each alone or in combination of two or more.

The amount of the alkanolamines is generally 0.01–0.8 mol, preferably 0.05–0.5 mol for 1 liter of the developer.

Alkanolamines are known as silver halide solvents and it is known that they can also form a transfer silver having good printing characteristics in lithographic printing plates. However, mere use of alkanolamines cannot form a transfer silver of high printing endurance in the plate making method of the present invention which uses the coating development method, but lithographic printing plates of good printing characteristics can be stably obtained by using the above-mentioned specific mercapto compounds in combination.

The meso-ionic compounds used in the present invention are preferably those which are represented by the following formula (2):

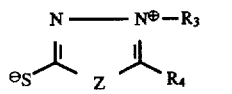

(2)

wherein Z represents O, S or $NR_5$ (where $R_5$ is as defined hereinafter), $R_3$ represents an unsubstituted or substituted alkyl, aryl, amino or heterocyclic ring group, $R_4$ and $R_5$ each represent a hydrogen atom or an unsubstituted or substituted alkyl, aryl, amino or heterocyclic ring group, and the substituents may form a ring together.

Typical examples of the meso-ionic compounds used in the present invention are shown below.

Compound 1

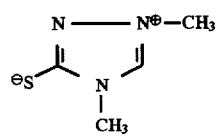

Compound 2

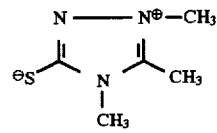

Compound 3

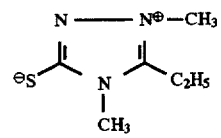

Compound 4

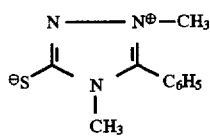

Compound 5

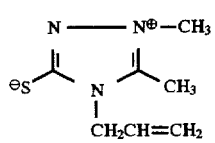

Compound 6

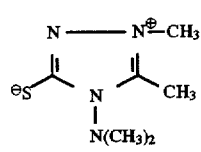

Compound 7

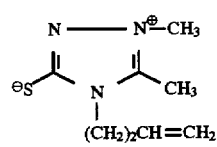

Compound 8

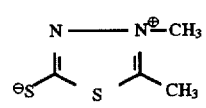

Compound 9

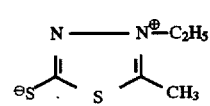

Compound 10

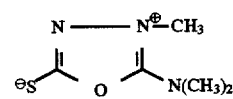

The amount of the meso-ionic compounds is generally 0.1–100 mmols, preferably 0.5–50 mmols for 1 liter of the developer.

JP-A-4-324448, 4-328559 and 6-83060 disclose that the above meso-ionic compounds improve printing endurance and ink receptivity. The mere use of the meso-ionic compounds cannot form a transfer silver of high printing endurance in the plate making method of the present invention which employs the coating development method, but lithographic printing plates of good printing characteristics can be stably obtained by using the above-mentioned specific mercapto compounds in combination.

In the present invention, more preferred results are obtained by using the alkanolamines and the meso-ionic compounds in combination.

In the present invention, thiosulfates, thiosalicylic acid, cyclic imides, thioethers and the like can also be used in combination as the silver halide solvents other than the alkanolamines and the meso-ionic compounds. Furthermore, mercapto compounds other than the 2-mercapto-5-alkyl (aryl)-1,3,4-oxadiazole, for example, mercaptotriazole and mercaptotetrazole can also be used in combination.

In the present invention, it is preferred that amount of potassium ion in the developer is 30–70 mol % of the total alkali metal ions. Particularly, sodium can be mentioned as alkali metals other than potassium. By balancing potassium ion and sodium ion, the DTR development can be optimally performed and high printing endurance can be obtained in the coating development method which employs a small amount of developer and is carried out for a short time.

In the developer used in the present invention, potassium ion and sodium ion may be supplied in any form and by any method. For example, they may be supplied in the form of hydroxide, sulfite, carbonate, silicate, nitrate or the like.

It is preferred to use a developer containing a weak acid ion and having a pH of 12 or more. The weak acid ion develops a function as a weak alkali only in the neutral or acidic atmosphere. Therefore, it develops the effect only when it is applied to a high pH developer of 12 or higher in pH which is used for DTR lithographic printing plates. Especially, when only a small amount of the developer is fed to the photosensitive surface as in the coating development method, it is considered that after the weak acid ion penetrates into the emulsion layer of the photographic elements for lithographic printing plates, it inhibits decrease of development activity in the film and maintains the activity.

It has been found that lithographic printing plates of high printing endurance which has not been able to be obtained by merely increasing the pH with increase of concentration of potassium hydroxide or sodium hydroxide can be realized by adding the weak acid ion to the developer.

As the source for the weak acid ion used in the present invention, mention may be made of weak acids and weak acid salt compounds. Examples thereof are inorganic weak acid ions such as phosphoric acid and salts thereof, pyrophosphoric acid and salts thereof, tripolyphosphoric acid and salts thereof, boric acid and salts thereof, carbonic acid and salts thereof, silicic acid and salts thereof, arsenic acid and salts thereof, vanadic acid and salts thereof, and the like and organic weak acid ions such as ascorbic acid and salts thereof, iminodiacetic acid and salts thereof, glutamic acid and salts thereof, nitrilotriacetic acid and salts thereof, citric acid and salts thereof, propionic acid and salts thereof, and the like. These may be used each alone or in combination of two or more. However, the compounds such as sulfites and thiosulfates which are silver halide solvents are not included in the weak acid ions of the present invention.

Counter ions for the above weak acid salts are not limited, and preferred are lithium, sodium and potassium.

The content of the weak acid ions in the developer used in the present invention is generally 5 mmols or more, preferably 20–100 mmols for 1 liter. Methods for the addition of the weak acid ions to the developer include a method of adding to the developer a weak acid or a weak acid salt compound which is the source of the ion and, then, adjusting the pH to 12 or more with potassium hydroxide or sodium hydroxide and a method of adding a weak acid or a weak acid salt compound to the developer which has been previously adjusted to pH 12 or more with sodium hydroxide or potassium hydroxide. In the latter method, if necessary, pH is re-adjusted to 12 or more after the addition of the weak acid or the weak acid salt compound.

In the present invention, it is preferred that the developer contains a quaternary salt polymer. The quaternary salt polymer is a polymer obtained by polymerizing a monomer having a quaternary ammonium salt, a pyridinium salt or a phosphonium salt in the monomer structure. Preferred quaternary salt polymers are polymers obtained by polymerizing the monomer so that they contain at least one monomer unit represented by the following formula (1). These monomers are available from Daiso Co., Ltd., Koei Chemical Co., Ltd., Seimi Chemical Co., Ltd. and others.

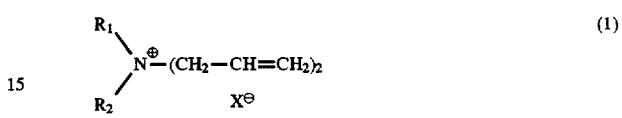

wherein $R_1$ and $R_2$ each represent a hydrogen atom or an alkyl group (e.g., lower alkyl group such as methyl group, ethyl group, propyl group or the like) and X represents an anion such as chloride ion, bromide ion or the like. The quaternary salt polymers used in the present invention may be homopolymers comprising the monomer unit of the formula (1), copolymers of two or more monomers selected from the monomers of the formula (1), or copolymers of at lest one monomer selected from the monomers of the formula (1) with other monomers. The homopolymers comprising the monomer unit of the formula (1) are preferred.

The monomers copolymerizable with the monomers of the formula (1) are various monomers which are generally used in the field of polymer synthesis, such as acrylamide, acrylate, methacrylate, acrylonitrile, styrene, sulfur dioxide and the like.

The proportion of the monomers of the formula (1) in the polymers is suitably 20% by weight or more, more preferably 50% by weight or more.

The quaternary salt polymers used in the present invention can be easily produced by known processes such as emulsion polymerization and solution polymerization. The number-average molecular weight (Mn) of the quaternary salt polymers is generally 10,000–600,000, preferably 100,000–300,000.

Examples of the polymers are enumerated below. These examples do not limit the present invention. The rate of polymerization is expressed by % by weight.

Compound 11

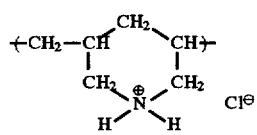

Mn = 50,000

Compound 12

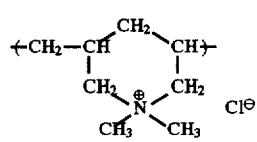

Mn = 50,000

Compound 13
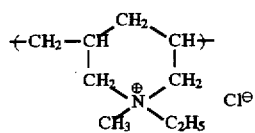
Mn = 100,000
Compound 14
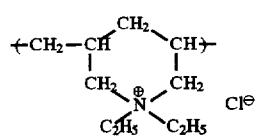
Mn = 100,000
Compound 15
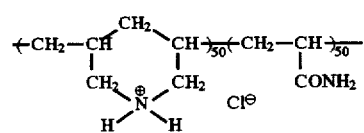
Mn = 200,000
Compound 16
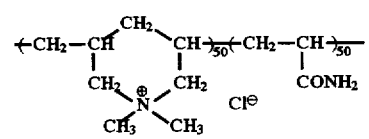
Mn = 200,000
Compound 17
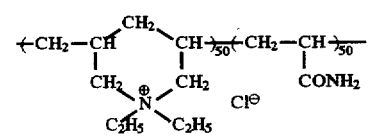
Mn = 200,000
Compound 18
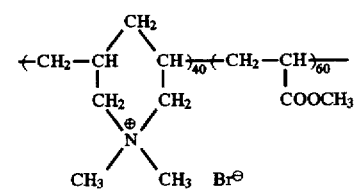
Mn = 300,000
Compound 19
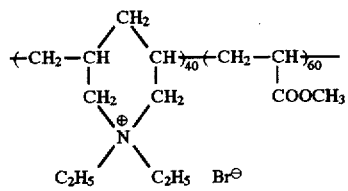
Mn = 300,000
Compound 20
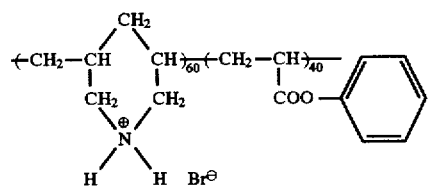
Mn = 150,000
Compound 21
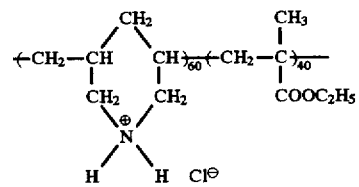
Mn = 200,000
Compound 22
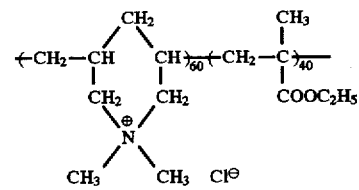
Mn = 200,000
Compound 23
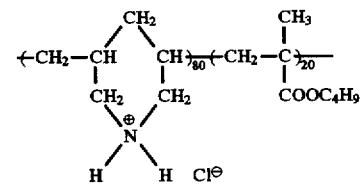
Mn = 300,000
Compound 24
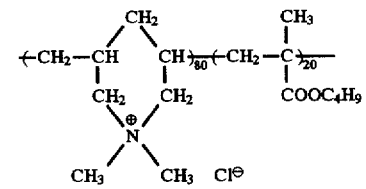
Mn = 300,000

Compound 25

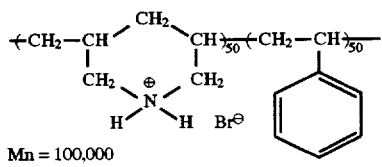

Mn = 100,000

Compound 26

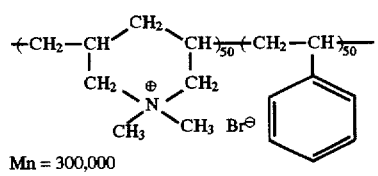

Mn = 300,000

Compound 27

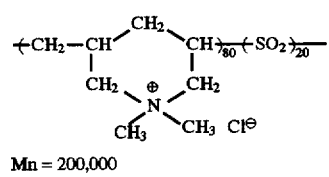

Mn = 200,000

Compound 28

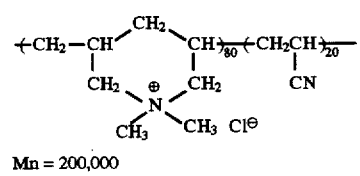

Mn = 200,000

Compound 29

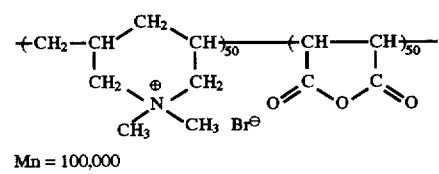

Mn = 100,000

Compound 30

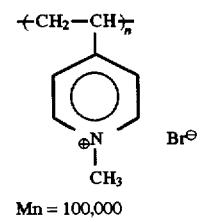

Mn = 100,000

Compound 31

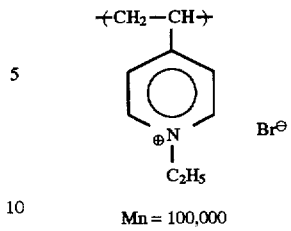

Mn = 100,000

Compound 32

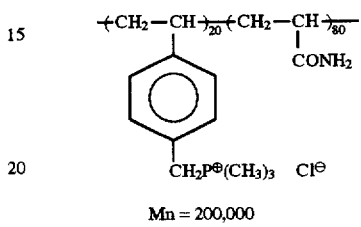

Mn = 200,000

The amount of the quaternary salt polymer used in the present invention is generally 0.5–30 g, preferably 5–15 g for 1 liter of the developer.

The quaternary salt polymer is adsorbed to the surface of image silver at a proper strength, thereby to capture the solubilized silver ion which diffuses and transfers to decrease the silver ion which is not deposited on the physical development nuclei and dissolves into the developer. On the other hand, the quaternary salt polymer coordinates with the silver ion which dissolves into the developer and solubilizes the silver ion in the developer as a polymer chelate. As a result, image forming efficiency is improved, mechanical strength of the image is increased, and formation of silver sludges is diminished.

In the present invention, the developer preferably contains a hydroxyaryl fatty acid. The ink receptivity is improved by using the above 2-mercapto-5-alkyl(aryl)oxa-3,4-diazole and the hydroxyaryl fatty acid in combination.

The hydroxyaryl fatty acid is preferably represented by the following formula:

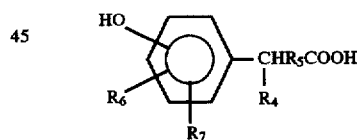

(wherein $R_4$ represents a straight chain alkyl group of 1–19 carbon atoms, $R_5$ represents a straight chain alkylene group of 1–19 carbon atoms, the sum of the carbon numbers in $R_4$ and $R_5$ is 10–20, and $R_6$ and $R_7$ each represent a hydrogen atom, a hydroxyl group or an alkyl or alkoxy group of 1–9 carbon atoms).

Examples of the hydroxyaryl fatty acids are hydroxyphenylmyristic acid, hydroxyphenylpalmitic acid, hydroxyphenylstearic acid, hydroxyphenyloleic acid, hydroxyphenylbehenic acid, bis-hydroxyphenylstearic acid, dihydroxyphenylpalmitic acid, trihydroxyphenylstearic acid, hydroxymethylphenylstearic acid, hydroxynonylphenylstearic acid, hydroxymethoxypalmitic acid, and the like. These compounds may be in the form of salts such as alkali metal salts, organic amines and the like.

The amount of the hydroxyaryl fatty acid contained in the developer is usually about 0.05–10 g/l, preferably about 0.5–5 g/l. Especially preferred amount is about 2–10 times the weight of 2-mercapto-5-alkyl(aryl)oxa-3,4-diazole.

The developer used in the present invention can additionally contain alkaline substance, e.g., sodium hydroxide, potassium hydroxide, lithium hydroxide, trisodium phosphate, etc.; sulfites as preservatives; thickening agents, e.g., hydroxymethylcellulose, carboxymethylcellulose, etc.; antifoggants, e.g., potassium bromide, the compounds disclosed in JP-A-47-26201, etc.; developing agents, e.g., hydroquinone, 1-phenyl-3-pyrazolidone; etc.

In carrying out the DTR process, the developing agent is incorporated into silver halide emulsion layer and/or image receiving layer or other water permeable hydrophilic colloid layers contiguous thereto as described in British Pat. Nos. 1,000,115, 1,012,476, 1,017,273, and 1,042,477. Therefore, in the case of such materials as employed in these patents, the processing solutions used at developing stage can be the so-called "alkaline activating solution" containing no developing agent.

A preferred embodiment of the photographic elements for making lithographic printing plates used in the present invention to which the silver complex diffusion transfer process is applied comprises a support and at least an undercoat layer, a silver halide emulsion layer and a physical development nuclei layer coated on the support in succession, the total amount of gelatin on the side of the support on which the emulsion layer is present being 1–4 g/m², titanium oxide being contained in the undercoat layer.

With decrease of the gelatin amount on the side of the support on which the emulsion layer is present, the ink releasability is improved. If the total gelatin amount is less than 1 g/m², the film is weak and inferior as a printing plate, and if it is more than 4 g/m², ink receptivity is inferior when the lithographic printing plate is processed by coating development method and releasing of ink is slow to cause deterioration in printing operability.

Titanium oxide used in the present invention may be any of anatase type, rutile type, and the like. From the point of dispersion stability, preferred is surface treated titanium oxide. Titanium oxide is usually dispersed in water and added at the time of make up before coating, but this is not necessarily limiting. The amount of titanium oxide varies depending on various conditions, but is usually 1–20 g/m².

As disclosed in JP-A-5-66564, a gelatin film has swellability with water and tends to lower the ink/water responsiveness. This is a phenomenon which occurs because the gelatin film absorbs dampening water fed to the plate surface until the gelatin film reaches saturation in swelling with the dampening water and the dampening water does not effectively act on the plate surface. In the case of changing the feeding amount of the dampening water, if gelatin amount is increased, the ink/water responsiveness lowers since giving and taking of the dampening water at the plate surface and the gelatin film occur simultaneously. The swelling of the gelatin film containing titanium oxide with water is small and the ink/water responsiveness does not lower so much. On the other hand, in order to reduce matting of the surface, addition of titanium oxide is effective, and this is also effective for improving dispersibility of the matting agent.

In addition to the above-mentioned action and effect on the ink/water responsiveness, it has been found that the layer (undercoat layer) containing titanium oxide is slow in swelling with developer and the DTR development activity can be easily maintained in the coating development which carries out the development with a small amount of developer for a short period of time. That is, it is presumed that penetration of the developer into the undercoat layer delays and decrease of pH in the film brought about by neutralization with gelatin at the initial stage of development is suppressed. Thus, there can be obtained plates which are not deteriorated in printing endurance even by development with a small amount of developer for a short time and excellent in adhesion of the layers.

In the present invention, it is preferred that the arithmetical mean deviation of profile (Ra) of the lithographic printing plate is 1.2 or less. If the arithmetical mean deviation of profile (Ra) of the lithographic printing plate is more than 1.2, the print quality tends to deteriorate.

The arithmetical mean deviation of profile (Ra) of the photographic element can be measured by surface roughness configuration measuring machines, for example, Surfcom 500B manufactured by Tokyo Seimitsu Co. When the portion of sampling length l to be measured in the direction of arithmetical mean line (center line) is extracted from profile curve and when center line of the extracted portion is assumed to be x-axis and the vertical direction is assumed to be y-axis and the profile curve is expressed by y=f(x), the arithmetical mean deviation of profile (Ra) is expressed by micrometer unit and calculated by the following formula.

$$Ra = (1/l) \cdot \int |f(x)| dx \, (\mu m)$$

The photographic elements for lithographic printing plates of the present invention contain gelatin as a binder, and the gelatin-containing layer can be the undercoat layer, the emulsion layer and the physical development nuclei layer. A part of the gelatin can be replaced with one or more of hydrophilic polymers such as starch, dextrin, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, polyvinylmethyl ether-maleic anhydride copolymer, etc.

These gelatin-containing layers can be hardened with gelatin hardeners. As the gelatin hardeners, mention may be made of various compounds, for example, inorganic compounds such as chrome alum, aldehydes such as formalin, glyoxal, malealdehyde and glutaraldehyde, N-methylol compounds such as urea and ethyleneurea, aldehydes such as mucochloric acid and 2,3-dihydroxy-1,4-dioxane, compounds having an active halogen such as 2,4-dichloro-6-hydroxy-S-triazine salt and 2,4-dihydroxy-6-chloro-S-triazine salt, divinyl sulfone, divinyl ketone, N,N,N-triacryloylhexahydro-triazine, compounds containing ethyleneimino group or epoxy group which is an active three-membered ring, and dialdehyde starch as a polymeric hardener. These may be used each alone or in combination of two or more.

The hardeners can be added to all of the layers or to some or only one of them. Of course, a diffusible hardener can be added only one of the two layers when these are coated simultaneously. The hardeners can be added at the time of preparation of the emulsion or at the time of coating in in-line manner.

In the present invention, it is preferred to use a matting agent having an average particle size of 0.3–5.0 microns in the constitutive layers on the side of the emulsion layer being present in the photographic elements for lithographic printing plates. Examples of the matting agent are silica particles and organic particles such as styrene. In the present invention, silica particles less in oil absorption which are disclosed in JP-A-7-168360 are especially preferred. Typical examples of such silica particles are CARPLEX (average particle diameter 1.2 microns) manufactured by Shionogi & Co., Ltd.

The matting agent is preferably contained in the undercoat layer provided between the support and the silver halide emulsion layer. The amount of the matting agent varies depending on various conditions, but it is generally 0.1–5.0 g/m$^2$, preferably 0.3–3.5 g/m$^2$ in the constitutive layers on the side of the emulsion layer being present.

The undercoat layer can contain pigments and dyes such as carbon black for the purpose of antihalation. Furthermore, it can contain photographic additives such as developing agent. Moreover, the undercoat layer can be such as described in JP-A-48-5503, 48-100203 and 49-16507.

It is preferred in the present invention to use in the undercoat layer a latex which is unswelling with water. The unswelling latex means a latex which is low in swellability with water and can be specified in the present invention in the following manner. That is, a test coating solution having the following composition is prepared and coated on a subbed polyethylene terephthalate film at a wet coating amount of 50 g/m$^2$ to prepare a test sample. Furthermore, a comparative coating solution which is the same as the above test coating solution except for containing no test latex is prepared and coated in the same manner as above to obtain a comparative sample.

| <Test coating solution> | |
|---|---|
| Gelatin | 40 g |
| Test latex (solid content) | 20 g |
| Cyroid (grade 308) manufactured by Fuji Davidson Co. | 6 g |
| Carbon black dispersion (32% in solid content) | 8 g |
| Formaldehyde (30% aqueous solution) | 2 g |
| Glyoxal (30% aqueous solution) | 4 g |
| Water is added to make up 500 g in total. | |

The thus obtained samples are dipped in a 1N sodium hydroxide for 1 minute, and increment in weight is measured and this is employed as the amount of solution absorbed. The ratio of the amount of the solution absorbed in the test sample and that of the comparative sample is called "swelling ratio". The latex of unswelling with water in the present invention is a latex of 1.2 or less, preferably 1.1 or less in this swelling ratio.

The latex unswelling with water in the present invention is preferably a styrene.butadiene latex, but there may also be used other latexes such as, for example, polybutadiene latexes, polystyrene latexes and styreneeisoprene latexes. The amount of the unswelling latex is 0.2–5.0 g/m$^2$ in terms of solid content.

It is considered that by containing the latex in the undercoat layer, like the titanium oxide mentioned above, swelling with the developer is delayed and the DTR developing activity can be readily maintained in the development of short time with a small amount of developer as in the case of coating development.

Silver halide emulsions used in the photographic elements for lithographic printing plates employed in the present invention can be silver chloride, silver bromide, silver chlorobromide, silver chloroiodide, silver chlorobromoiodide, and the like. Preferred are silver halides containing at least 70 mol % of silver chloride. These silver halides can contain spectral sensitizers (spectral sensitizing dyes depending on light source and use, such as those of camera type, laser beam type, color separation panchromatic type, and the like), gelatin hardeners, coating aids, antifoggants, plasticizers, developing agents, matting agents, and the like.

The supports used in the present invention include, for example, paper, various films, plastics, papers or metals coated with resinous materials.

As the physical development nuclei in the physical development nuclei layer, use may be made of those which are well known, such as metals including antimony, bismuth, cadmium, cobalt, palladium, nickel, silver, lead, and zinc, and sulfides of these metals. The physical development nuclei described in JP-A-5-265164 may also be used. The physical development nuclei layer may also contain a developing agent and a water-soluble binder.

The lithographic printing plates made according to the present invention can be made ink receptive or enhanced in the ink receptivity by the compounds described in JP-B-48-29723 and U.S. Pat. No. 3,721,539.

The printing method, etch (desensitizing) solution and dampening solution can be those which are generally known to the art.

The present invention will be explained by the following nonlimiting examples.

EXAMPLE 1

The developing apparatus described in U.S. Pat. No. 5,398,092 was used as a coating type developing apparatus.

As the photographic element for making lithographic printing plate utilizing the DTR process, one which comprised a polyester film support subjected to subbing treatment and, coated thereon in succession, an antihalation layer containing silica particles, an orthochromatically sensitized silver chloride emulsion layer and a physical development nuclei layer and which had a width of 254 mm and a length of 400 mm was used. The photographic elements (ten sheets) were exposed through thin line images by a process camera having an image reversal mechanism.

The following developer A and stabilizing solution (neutralizing solution) were used as processing solutions for plate making. The temperature for treating with the developer A and the stabilizing solution was 30° C. and the coating amount of the developer A and the stabilizing solution was 40 ml per 1 m$^2$ of the photographic elements. After lapse of 8 seconds from coating the developer, the stabilizing solution was coated.

| Developer A: | |
|---|---|
| Potassium hydroxide | 17 g |
| Sodium hydroxide | 7 g |
| Potassium sulfite | 44 g |
| N-(2-aminoethyl)ethanolamine | 15 g |
| 3-Mercapto-4-acetamide-5-n-butyl-1,2,4-triazole | 0.5 m mol |
| Water was added to make up 1000 ml in total. | |
| Stabilizing solution: | |
| Monobasic potassium phosphate | 32 g |
| Phosphoric acid | 2 g |
| Sodium sulfite | 3 g |
| EDTA-Na | 1 g |
| Water was added to make up 1000 ml in total. | |

Developer B was prepared by replacing the mercaptotriazole in developer A with 0.5 mmol of 1-phenyl-5-mercaptotetrazole and developer C was prepared by replacing the mercaptotriazole in developer A with 0.5 mmol of 2-mercapto-5-heptyloxa-3,4-diazole. Using developer B and developer C, printing plates were made in the same manner as in the case of using developer A.

Printing was carried out using Heidenberg TOK offset printing machine by applying the etch solution all over the plate surface and using a dampening solution for DTR lithographic printing plates.

In the case of lithographic printing plates (A) made using developer A, two of the ten plates had top end portion and both side end portions which were inferior in ink receptivity and after printing of 3000 copies, thin lines of 100 microns disappeared and, furthermore, stains occurred on the background. Lithographic printing plates (B) made using developer B were somewhat improved in ink receptivity over the printing plates (A), but printing endurance of thin lines was similarly low and stains also occurred on the background. On the other hand, all of ten lithographic printing plates (C) made using developer C were Mesuperior in ink receptivity and high in printing endurance with showing no such stains on the background as seen in the printing plates (A).

For reference, printing plates were made using developers A, B and C and the stabilizing solution at a coating amount of 80 ml. As a result, all of the printing plates obtained had superior ink receptivity and high printing endurance with causing no stains on the background.

EXAMPLE 2

Example 1 was repeated, except that N-methylethanolamine or 4-aminobutanol was used in place of N-(2-aminoethyl)ethanolamine in the developer. The results were similar to those of Example 1.

EXAMPLE 3

Example 1 was repeated, except that developers A-1, A-2, B-1, B-2 or C-1, C-2 which contained 4 mmols of the meso-ionic compound 2 or 7 exemplified hereinbefore in place of N-(2-aminoethyl)ethanolamine in the developers A, B and C were used in place of the developers A, B and C. The results obtained were similar to those of Example 1. That is, the developers C-1 and C-2 of the present invention were superior to the comparative developers A-1, A-2 and B-1, B-2.

EXAMPLE 4

Example 1 was repeated, except that developers A-3, A-4, B-3, B-4 or C-3, C-4 prepared by adding 4 mmols of the meso-ionic compound 2 or 7 exemplified hereinbefore to the developers A, B and C were used in place of the developers A, B and C and the coating amount of the developers was changed to 25 ml/m$^2$. As a result, in the case of lithographic printing plates made using the developers A-3 and A-4 and B-3 and B-4, thin line images of 100 microns disappeared after printing of 4,000 copies with occurrence of stains on the background. On the other hand, lithographic printing plates made using the developers C-3 and C-4 had a high printing endurance, namely, 8,000 copies could be printed by all of the ten printing plates.

EXAMPLE 5

Developer D was prepared in the same manner as in preparation of developer C in Example 1, except that a part of potassium sulfite was replaced with sodium sulfite and potassium ion content was adjusted to 50 mol % of the total alkali metal ions (total of potassium ion and sodium ion). The same test as in Example 1 was conducted using the developer D. All of the ten printing plates were superior in ink receptivity, formed no stains on the background before printing of 6,000 copies and had a high printing endurance.

EXAMPLE 6

The following undercoat layer was coated on a polyester film support subjected to aqueous subbing treatment with a subbing composition containing an epoxy compound disclosed in JP-A-60-213942.

| <Undercoat layer> | |
|---|---|
| Gelatin | 2.5 g |
| Water | 20.0 g |
| Carplex (FPS-101, average particle size: 1.1 μm manufactured by Shionogi & Co., Ltd.) | 2.5 g |
| Titanium oxide (SR-1 manufactured by Sakai Chemical Co., Ltd.) | 3.0 g |
| Carbon black dispersion (solid content 32%) | 0.8 g |
| Formaldehyde (30% aqueous solution) | 0.2 g |
| Glyoxal (30% aqueous solution) | 0.4 g |
| Surface active agent | 0.6 ml |
| Water was added to make up 50.0 g in total. | |

The coating amount of the undercoat layer was 50 g/m$^2$ in terms of wet coating amount. Thereon was coated an orthochromatically sensitized high contrast silver chloride emulsion at a coating amount of 1.5 g/m$^2$ in terms of silver nitrate (gelatin content in the emulsion layer: 1.0 g/m$^2$). After drying, the coat was heated at 50° C. for 2 days and thereon was coated a physical development nuclei layer coating solution described in Example 2 of JP-A-53-21602 (containing polymer No. 3 which was a copolymer of acrylamide and imidazole and 0.8 g/m$^2$ of hydroquinone as a developing agent) to which the compound of formula 4 described in JP-A-6-332183 was added in an amount of 0.04 g/m$^2$. This photographic element had an arithmetical mean deviation of profile (Ra) of 0.4.

The photographic element was exposed through thin line images by a plate maker and, then, processed with the following developer and stabilizing solution by a developing apparatus described in WO95/18400. The processing temperature with the developer and the stabilizer was 30° C., and the coating amount was 40 ml/m$^2$. After 8 seconds from coating the developer, the stabilizer was coated.

| <Diffusion transfer developer> | |
|---|---|
| Water | 700 g |
| Sodium hydroxide | 18 g |
| Potassium hydroxide | 7 g |
| Anhydrous sodium sulfite | 50 g |
| 2-Mercaptobenzoic acid | 1 g |
| Uracil | 10 g |
| 2-Methylaminoethanol | 30 g |
| 5-Phenyl-1-2-mercapto-1,3,4-oxadiazole | 0.56 m mol |
| Potassium bromide | 1 g |
| Water was added to make up 1,000 ml in total. | |
| <Stabilizing solution> | |
| Water | 600 g |
| Citric acid | 10 g |
| Sodium citrate | 35 g |
| Colloidal silica (20% | 5 g |
| Ethylene glycol | 5 g |
| Water was added to make up 1,000 ml in total. | |

Printing was carried out using A. B. Dick 350CD (offset printing machine manufactured by A. B. Dick Co., Ltd.), and ink releasability and printing endurance were evaluated. The ink releasability was evaluated in the following manner. An ink was applied to all over the surface in dry state without treating with an etch solution to put the surface in the state of causing occurrence of stain on the background of the resulting prints. Printing was started with feeding the following dampening solution, and the ink releasability was expressed by the number of prints before the stain no longer occurred. The printing endurance was evaluated by the number of prints before the print image began to disappear owing to falling off of the silver image and, thus, printing became impossible. As a result, for all of the ten printing plates, the ink releasability was superior, namely, less than 80 prints, and with respect to the printing endurance, no problems occurred before printing of 10000 prints.

<Dampening solution>

| | |
|---|---|
| Orthophosphoric acid | 10 g |
| Nickel nitrate | 5 g |
| Sodium nitrite | 5 g |
| Ethylene glycol | 100 g |
| Colloidial silica (20% solution) | 28 g |
| Water was added to make up 2,000 ml in total. | |

EXAMPLE 7

Example 6 was repeated, except that the following undercoat layer was used.

<Undercoat layer>

| | |
|---|---|
| Gelatin | 2.5 g |
| Water | 20.0 g |
| Silicia 435 (average particle size: 2.5 μ manufactured by Fuji Silicia Co., Ltd.) | 0.9 g |
| Carbon black dispersion (solid content 32%) | 0.8 g |
| Formaldehyde (30% aqueous solution) | 0.2 g |
| Glyoxal (30% aqueous solution) | 0.4 g |
| Polylac 752A (styrene·butadiene latex, solid content 47.5% manufactured by Mitsui Toatsu Chemicals, Inc.) | 5.0 g |
| Surface active agent | 0.6 ml |
| Water was added to make up 50.0 g in total. | |

The swelling ratio of the above latex was 1.08. The wet coating amount of the undercoat layer was 50 g/m². Thereon were coated the emulsion layer and the physical development nuclei layer in the same manner as in Example 6 to prepare a photographic element for lithographic printing plate. The arithmetical mean deviation of profile (Ra) thereof was 0.8. The tests were conducted in the same manner as in Example 6 to obtain the similar results.

What is claimed is:

1. A method for making a lithographic printing plate in accordance with silver complex diffusion transfer process comprising exposure and development in the presence of a silver halide solvent of a photographic element comprising a support, a sliver halide emulsion layer and a physical development nuclei layer wherein the silver halide solvent complexes with unexposed silver halide from the silver halide emulsion layer to diffuse silver complexes to the nuclei layer, said development being a coating development method, wherein the coating amount of developer is 60 ml or less per 1 m² of the photographic element and the developer contains a mercaptooxa-3,4-diazole having an alkyl group of 4 or more carbon atoms or aryl group and an alkanolamine and/or a mesoionic compound.

2. A method according to claim 1, wherein the developer contains potassium ion in an amount of 30–70 mol % of the total alkali metal ions.

3. A method according to claim 1, wherein the developer contains at least one weak acid ion and has a pH of 12 or higher.

4. A method according to claim 1, wherein the developer contains at least one quaternary salt polymer.

5. A method according to claim 4, wherein the quaternary salt polymer has a monomer unit represented by the formula (1):

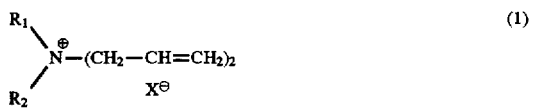

wherein $R_1$ and $R_2$ each represent a hydrogen atom or an alkyl group and X represents an anion.

6. A method according to claim 1, wherein the developer contains a hydroxyaryl fatty acid.

7. A method according to claim 1, wherein the photographic element comprises a support and at least an undercoat layer, a silver halide emulsion layer and a physical development nuclei layer coated in succession on the support, the total amount of gelatin on the side of the support on which the emulsion layer is present being 1–4 g/m², said undercoat layer containing titanium oxide.

8. A method according to claim 1, wherein the photographic element comprises a support and at least an undercoat layer, a silver halide emulsion layer and a physical development nuclei layer coated in succession on the support and has an arithmetical mean deviation of profile (Ra) of 1.2 or less.

9. A method according to claim 1, wherein the photographic element comprises a support and at least an undercoat layer, a silver halide emulsion layer and a physical development nuclei layer coated in succession on the support, said undercoat layer containing a latex which is unswelling with water.

* * * * *